United States Patent
Lin et al.

(10) Patent No.: US 8,089,164 B2
(45) Date of Patent: Jan. 3, 2012

(54) SUBSTRATE HAVING OPTIONAL CIRCUITS AND STRUCTURE OF FLIP CHIP BONDING

(75) Inventors: Ko-Wei Lin, Kaohsiung (TW);
Yun-Hsiang Tien, Kaohsiung (TW);
Kun-Ting Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 108 days.

(21) Appl. No.: 12/586,491

(22) Filed: Sep. 23, 2009

(65) Prior Publication Data
US 2010/0176516 A1    Jul. 15, 2010

(30) Foreign Application Priority Data

Jan. 14, 2009 (TW) ................ 98101263 A

(51) Int. Cl.
*H01L 23/48* (2006.01)
*H01L 23/52* (2006.01)
*H01L 29/40* (2006.01)
*H01L 23/28* (2006.01)

(52) U.S. Cl. ......... 257/778; 257/787; 257/784; 257/690

(58) Field of Classification Search ............. 257/778, 257/784, 690, 686, 738, 779, 780, 685, 787, 257/692
See application file for complete search history.

(56) References Cited

U.S. PATENT DOCUMENTS

| 6,472,749 | B1 | 10/2002 | Hirano et al. |
| 2004/0113253 | A1* | 6/2004 | Karnezos ................ 257/686 |
| 2008/0088011 | A1* | 4/2008 | Hu et al. ................ 257/723 |
| 2008/0203555 | A1 | 8/2008 | Hsu et al. |

* cited by examiner

*Primary Examiner* — Chuong A. Luu
(74) *Attorney, Agent, or Firm* — McCracken & Frank LLC

(57) ABSTRACT

The present invention relates to a substrate having optional circuits and a structure of flip chip bonding. The substrate includes a substrate body, at least one substrate pad, a first conductive trace and a second conductive trace. The substrate body has a surface. The substrate pad is disposed on the surface of the substrate body. The first conductive trace is connected to a first circuit, and has a first breaking area so it forms a discontinuous line. The second conductive trace is connected to a second circuit, and has a second breaking area so tit forms a discontinuous line. The second conductive trace and the first conductive trace are connected to the same substrate pad. Thus, the substrate can choose to connect different circuits, so the substrate can be applied to different products by connecting the desired circuit, thus reducing the manufacturing cost.

17 Claims, 9 Drawing Sheets

SUBSTRATE HAVING OPTIONAL CIRCUITS AND STRUCTURE OF FLIP CHIP BONDING

BACKGROUND OF THE INVENTION

1. Field of the Invention

The present invention relates to a substrate and a structure of bonding. More particularly, the present invention relates to a substrate having optional circuits and a structure of flip chip bonding.

2. Description of the Related Art

FIG. 1 shows a top view of a first conventional structure of wiring bonding. The structure 1A of wiring bonding comprises a substrate 11, a chip 12 and a plurality of wires 13. The substrate 11 comprises a first substrate pad 111 and a second substrate pad 112. The first substrate pad 111 is connected to a first circuit 113. The second substrate pad 112 is connected to a second circuit 114. The chip 12 adheres to the substrate 11, and comprises at least one chip pad 121. The wires 13 electrically connect the substrate 11 and the chip 12. As shown in the figure, the bottom wire 13 electrically connects the first substrate pad 111 of the substrate 11 and the bottom chip pad 121 of the chip 12. In another application, the bottom wire 13 may electrically connect the second substrate pad 112 of the substrate 11 and the chip pad 121 of the chip 12, so as to form a second conventional structure 1B of wiring bonding, as shown in FIG. 2. Therefore, the bottom wire 13 may connect different substrate pads (the first substrate pad 111 or the second substrate pad 112) by a wiring process, so that the substrate 11 and the chip 12 can optionally connect different circuits instead of manufacturing different types of substrates or chips.

The above-described conventional structures 1A, 1B of wiring bonding can connect different circuits by utilizing the wires 13 to connect different substrate pads. However, a conventional structure of flip chip bonding does not have such function. That is, in the conventional structure of flip chip bonding, once the chip and the substrate are manufactured and bonded, the connected circuit is fixed, and cannot be changed.

Therefore, it is necessary to provide a substrate having optional circuits and a structure of flip chip bonding to solve the above problems.

SUMMARY OF THE INVENTION

The present invention is directed to a substrate having optional circuits. The substrate comprises a substrate body, at least one substrate pad, a first conductive trace and a second conductive trace. The substrate body has a surface. The substrate pad is disposed on the surface of the substrate body. The first conductive trace is connected to a first circuit, and has a first breaking area so it forms a discontinuous line. The second conductive trace is connected to a second circuit, and has a second breaking area so it forms a discontinuous line. The second conductive trace and the first conductive trace are connected to the same substrate pad.

The present invention is further directed to a substrate having optional circuits. The substrate comprises a substrate body, at least one substrate pad, a first conductive trace and a second conductive trace. The substrate body has a surface. The substrate pad is disposed on the surface of the substrate body. The first conductive trace is connected to a first circuit. The second conductive trace is connected to a second circuit. The second conductive trace and the first conductive trace are connected to the same substrate pad.

The present invention is further directed to a substrate having optional circuits. The substrate comprises a substrate body, a first substrate pad, a second substrate pad and a substrate protecting material. The substrate body has a surface. The first substrate pad is disposed on the surface of the substrate body, and connected to a first circuit. The second substrate pad is disposed on the surface of the substrate body, and connected to a second circuit. The substrate protecting material covers the first substrate pad, and exposes the second substrate pad.

The present invention is further directed to a structure of flip chip bonding. The structure of flip chip bonding comprises a chip and a substrate. The chip has an active surface and a backside surface, and the active surface has at least one bump. The substrate comprises a substrate body, at least one substrate pad, a first conductive trace and a second conductive trace. The substrate body has a surface. The substrate pad is disposed on the surface of the substrate body, and the bump connects the substrate pad. The first conductive trace is connected to a first circuit, and the second conductive trace is connected to a second circuit. The second conductive trace and the first conductive trace are connected to the same substrate pad. One of the first conductive trace and the second conductive trace is not an open circuit, and the other one is an open circuit.

The present invention is further directed to a structure of flip chip bonding. The structure of flip chip bonding comprises a chip and a substrate. The chip comprises a chip body, a first chip pad, a second chip pad, a chip protecting material and a bump. The chip body has a surface. The first chip pad is disposed on the surface of the chip body. The second chip pad is disposed on the surface of the chip body, and connected to the first chip pad by a connecting circuit. The chip protecting material covers the first chip pad or the second chip pad, and exposes the other one. The bump is disposed on the exposed chip pad. The substrate comprises a substrate body, a first substrate pad, a second substrate pad and a substrate protecting material. The substrate body has a surface. The first substrate pad is disposed on the surface of the substrate body, and connected to a first circuit. The position of the first substrate pad corresponds to that of the first chip pad. The second substrate pad is disposed on the surface of the substrate body, and connected to a second circuit. The position of the second substrate pad corresponds to that of the second chip pad. The bump of the chip connects a corresponding substrate pad. The substrate protecting material covers the surface of the substrate body, and exposes the first substrate pad and the second substrate pad.

The present invention is further directed to a structure of flip chip bonding. The structure of flip chip bonding comprises a chip and a substrate. The chip comprises a chip body, a first chip pad, a second chip pad, a chip protecting material and at least one bump. The chip body has a surface. The first chip pad is disposed on the surface of the chip body. The second chip pad is disposed on the surface of the chip body, and connected to the first chip pad by a connecting circuit. The chip protecting material covers the surface of the chip body, and exposes the first chip pad and the second chip pad. The bumps are disposed on the first chip pad and the second chip pad. The substrate comprises a substrate body, a first substrate pad, a second substrate pad and a substrate protecting material. The substrate body has a surface. The first substrate pad is disposed on the surface of the substrate body, and connected to a first circuit. The position of the first substrate pad corresponds to that of the first chip pad. The second substrate pad is disposed on the surface of the substrate body, and connected to a second circuit. The position of the second substrate pad corresponds to that of the second chip pad. The substrate protecting material covers the first substrate pad or the second substrate pad, and exposes the other one. The bump of the chip connects the exposed substrate pad.

In this way, the substrate having optional circuits and the structure of flip chip bonding can choose to connect different circuits, so that the substrate having optional circuits and the structure of flip chip bonding can be applied to different products by connecting the appropriate circuit, thus reducing the manufacturing cost.

DETAILED DESCRIPTION OF THE INVENTION

Figure 1:
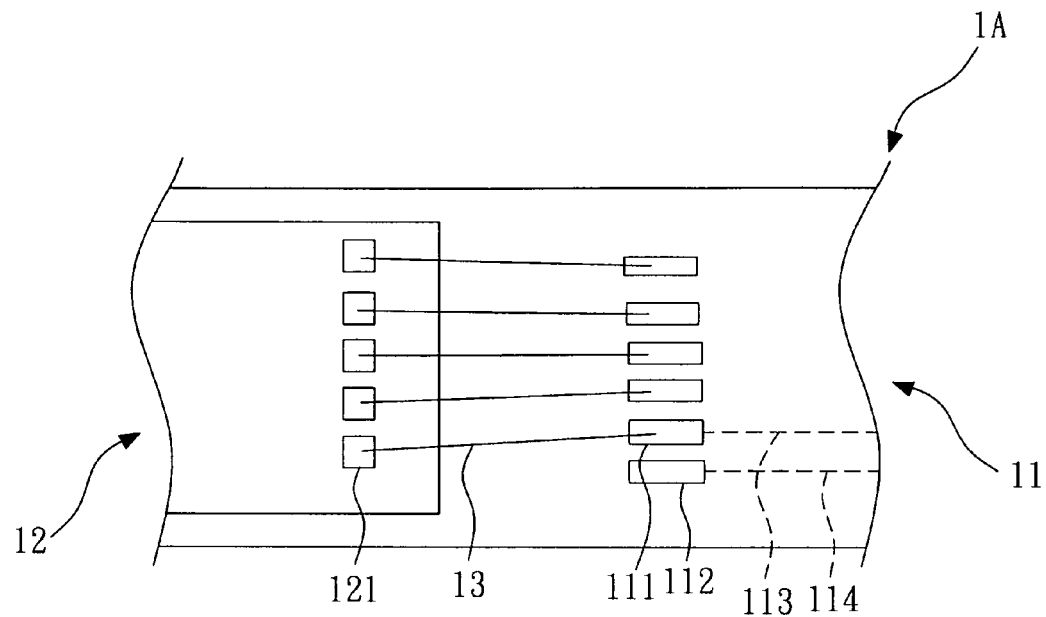
FIG. 1 is a top view of a first conventional structure of wiring bonding.
Figure 2:
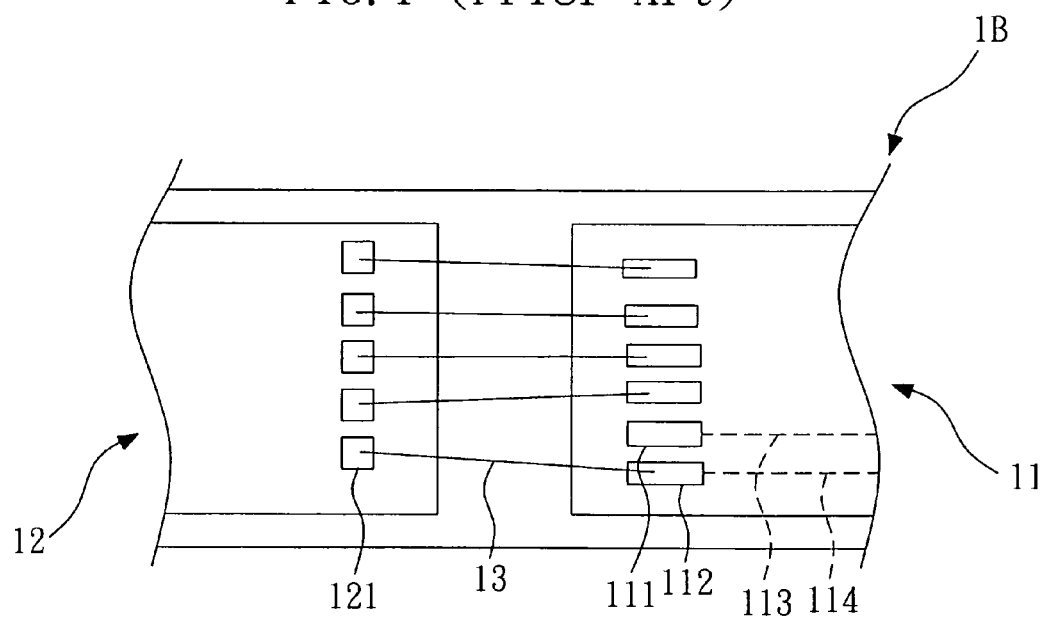
FIG. 2 is a top view of a second conventional structure of wiring bonding.
Figure 3:
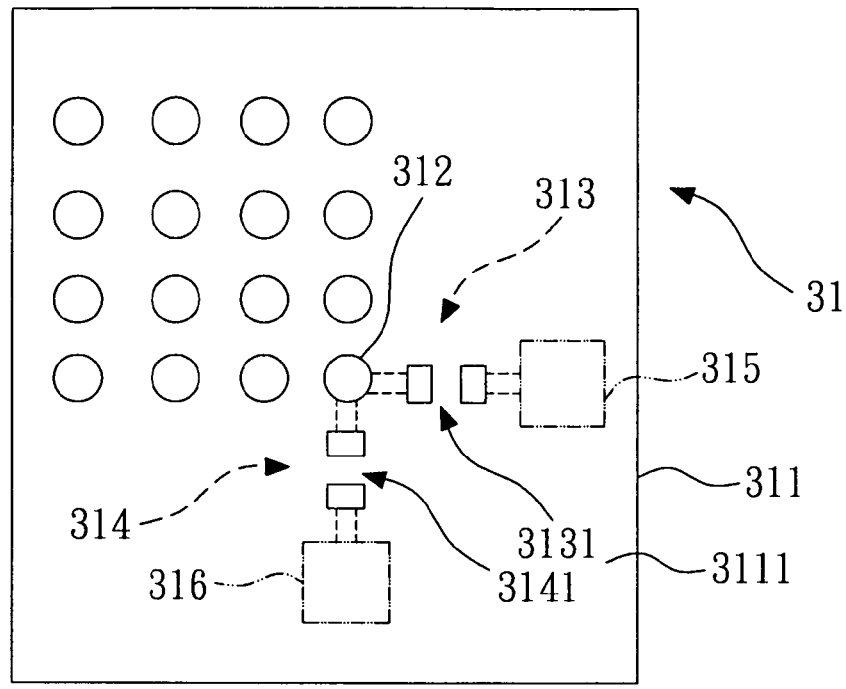
FIG. 3 is a top view of a substrate having optional circuits according to a first embodiment of the present invention.

FIG. 3 shows a top view of a substrate having optional circuits according to a first embodiment of the present invention. The substrate 31 comprises a substrate body 311, at least one substrate pad 312, a first conductive trace 313 and a second conductive trace 314. The substrate body 311 has a surface 3111. The substrate pad 312 is disposed on the surface 3111 of the substrate body 311. The first conductive trace 313 is connected to a first circuit 315, and has a first breaking area 3131, so it forms a discontinuous line. The second conductive trace 314 is connected to a second circuit 316, and has a second breaking area 3141 so it forms a discontinuous line. The second conductive trace 314 and the first conductive trace 313 are connected to the same substrate pad 312. In the embodiment, the substrate pad 312, the first conductive trace 313, the first circuit 315, the second conductive trace 314 and the second circuit 316 are coplanar, that is, they are all disposed on the same layer/level of the substrate body 311. It is understood that the substrate 31 may have more than two conductive traces. Each of the conductive traces is connected to a circuit, and has a breaking area so it forms a discontinuous line, and all of the conductive traces are connected to the same substrate pad.

Figure 4:
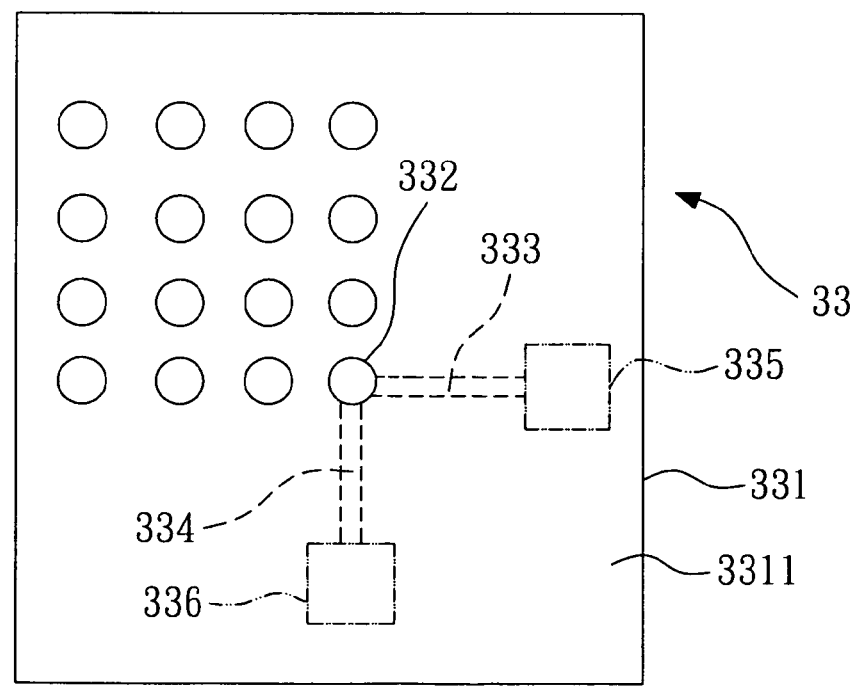
FIG. 4 is a top view of a substrate having optional circuits according to a second embodiment of the present invention.

FIG. 4 shows a top view of a substrate having optional circuits according to a second embodiment of the present invention. The substrate 33 comprises a substrate body 331, at least one substrate pad 332, a first conductive trace 333 and a second conductive trace 334. The substrate body 331 has a surface 3311. The substrate pad 332 is disposed on the surface 3311 of the substrate body 331. The first conductive trace 333 is connected to a first circuit 335. The second conductive trace 334 is connected to a second circuit 336. The second conductive trace 334 and the first conductive trace 333 are connected to the same substrate pad 332. In the embodiment, the substrate pad 332, the first conductive trace 333, the first circuit 335, the second conductive trace 334 and the second circuit 336 are coplanar, that is, they are all disposed on the same layer/level of the substrate body 331. It is understood that the substrate 33 may have more than two conductive traces. Each of the conductive traces is connected to a circuit, and all of the conductive traces are connected to the same substrate pad.

Figure 5:
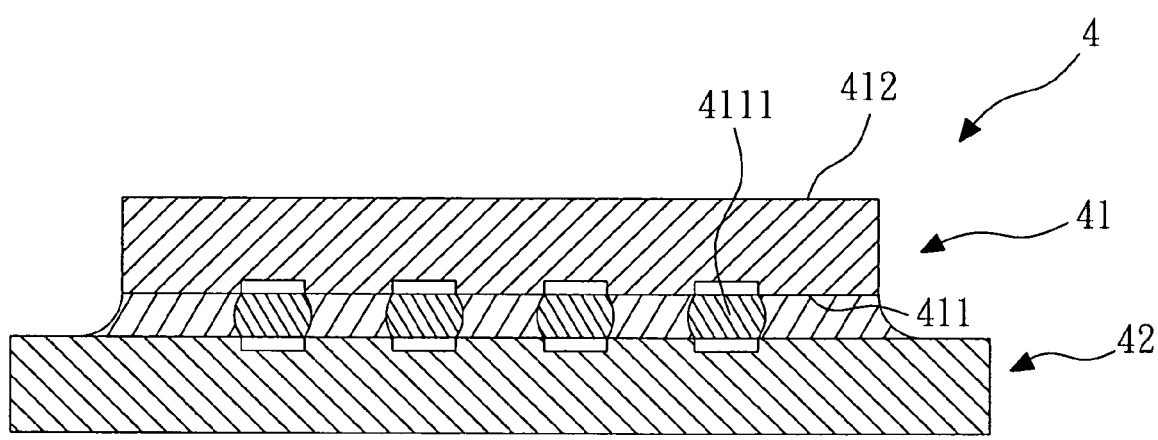
FIG. 5 is an assembly schematic view of a structure of flip chip bonding according to a first embodiment of the present invention.
Figure 6:
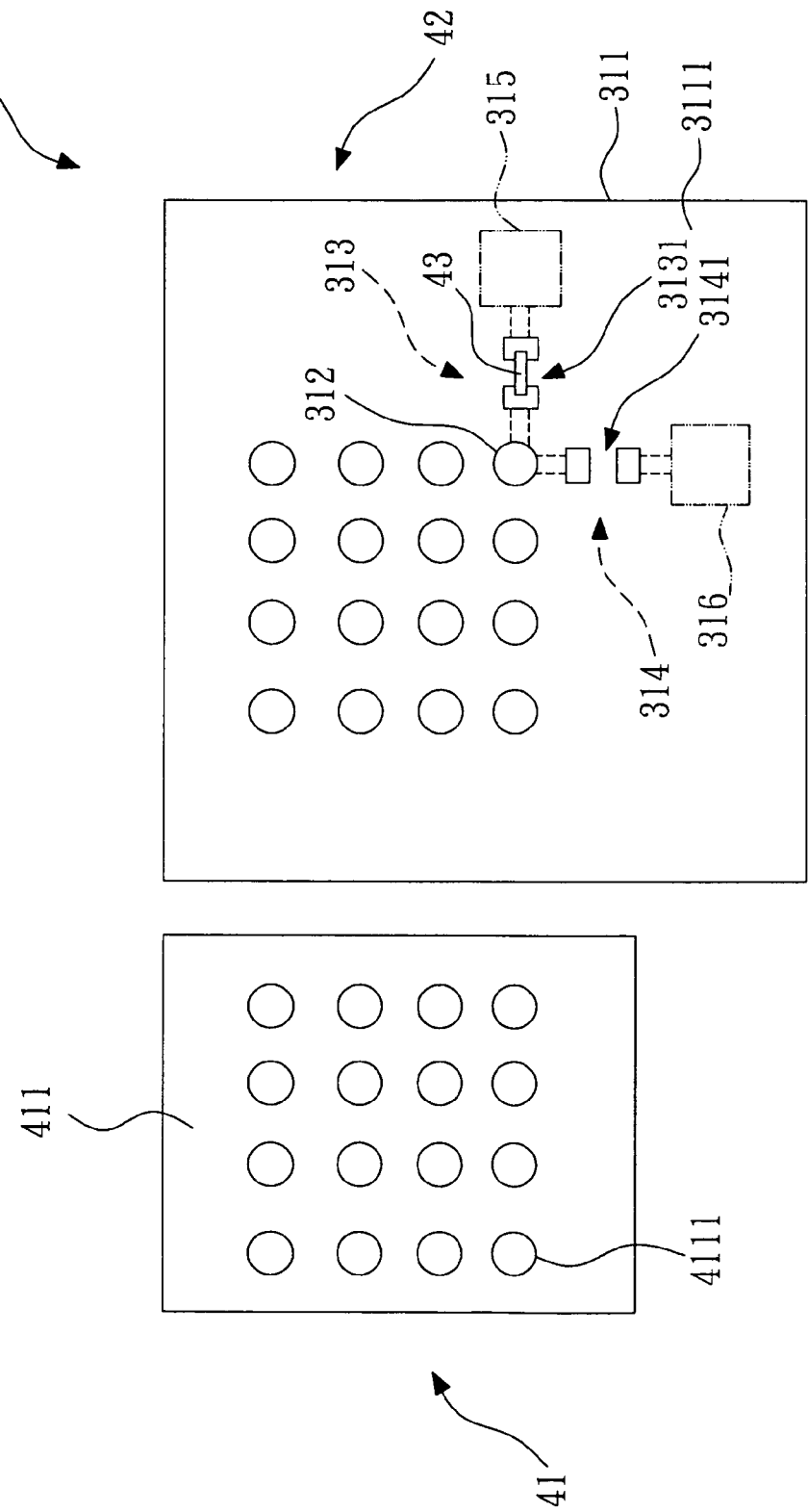
FIG. 6 is an exploded schematic view of a structure of flip chip bonding according to the first embodiment of the present invention.

FIGS. 5 and 6 show an assembly schematic view and an exploded schematic view, respectively, of a structure of flip chip bonding according to a first embodiment of the present invention. The structure 4 of flip chip bonding comprises a chip 41 and a substrate 42. The chip 41 has an active surface 411 and a backside surface 412. The active surface 411 has at least one bump 4111. The substrate 42 is substantially the same as the substrate 31 in FIG. 3. In the structure 4 of flip chip bonding, one of the first conductive trace 313 and the second conductive trace 314 is not an open circuit, and the other one is an open circuit. In the embodiment, after the chip 41 is bonded to the substrate 42, the structure 4 of flip chip bonding further comprises a conductor 43. The conductor 43 is a passive device (resistor, capacitor or inductor) or made of conductive material. The conductor 43 is disposed on the first breaking area 3131, so that the first conductive trace 313 is not an open circuit. Therefore, the bump 4111 is electrically connected to the first circuit 315. It is understood that the conductor 43 may be disposed on the second breaking area 3141, so that the second conductive trace 314 is connected (meanwhile, the first conductive trace 313 is an open circuit). Thus, after the chip 41 is bonded to the substrate 42, user can choose to connect the first conductive trace 313 or the second conductive trace 314, so that the bump 4111 may be electrically connected to the first circuit 315 or the second circuit 316. It is understood that the substrate 42 may have more than two conductive traces. One of the conductive traces is not an open circuit, and the others are open circuits.

Figure 7:
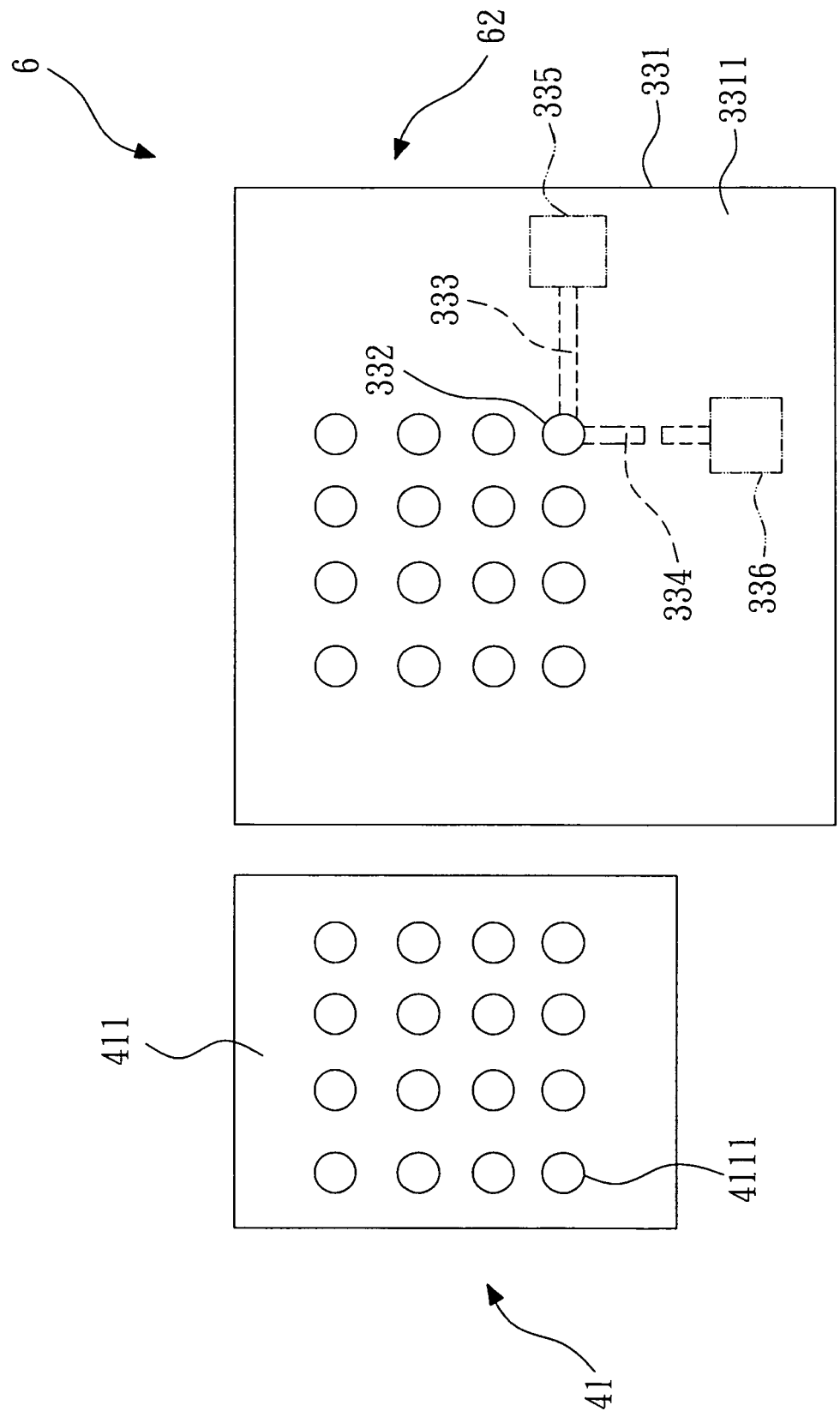
FIG. 7 is an exploded schematic view of a structure of flip chip bonding according to a second embodiment of the present invention.

FIG. 7 shows an exploded schematic view of a structure of flip chip bonding according to a second embodiment of the present invention. The structure 6 of flip chip bonding comprises a chip 41 and a substrate 62. The chip 41 has an active surface 411 and a backside surface 412. The active surface 411 has at least one bump 4111. The substrate 62 is substantially the same as the substrate 33 in FIG. 4. In the structure 6 of flip chip bonding, one of the first conductive trace 333 and the second conductive trace 334 is not an open circuit, and the other one is an open circuit. In the embodiment, after the chip 41 is bonded to the substrate 62, the second conductive trace 334 is cut, so that the second conductive trace 334 is an open circuit. Therefore, the bump 4111 is electrically connected to the first circuit 335. It is understood that the substrate 62 may have more than two conductive traces. After the chip 41 is bonded to the substrate 62, user can choose to keep one of the conductive traces, and cut the others.

Figure 8:
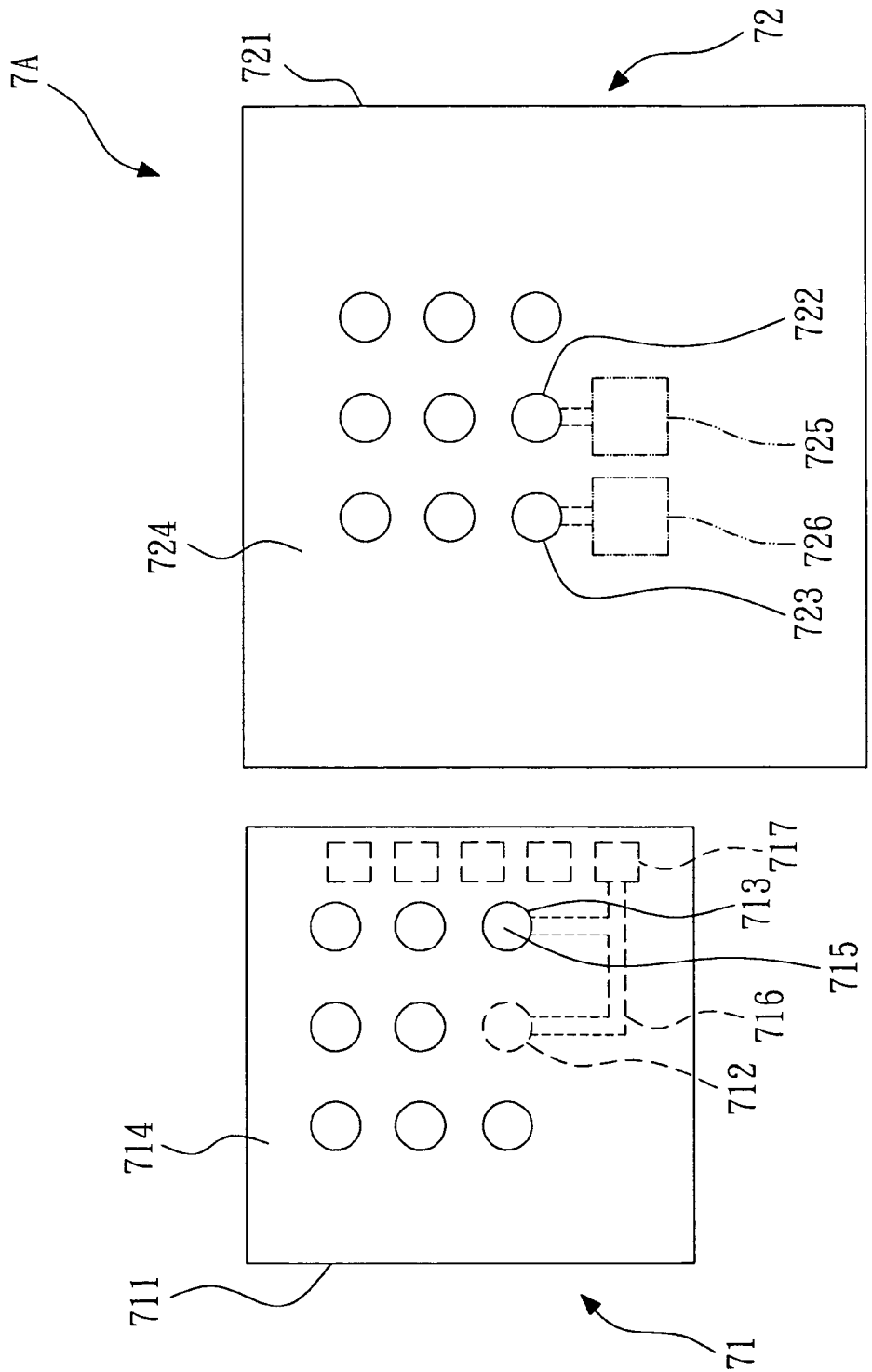
FIG. 8 is an exploded schematic view of a structure of flip chip bonding according to a third embodiment of the present invention.

FIG. 8 shows an exploded schematic view of a structure of flip chip bonding according to a third embodiment of the present invention. The structure 7A of flip chip bonding comprises a chip 71 and a substrate 72. The chip 71 comprises a chip body 711, a first chip pad 712, a second chip pad 713, a chip protecting material 714 and a bump 715. The chip body 711 has a surface (not shown). The first chip pad 712 and the second chip pad 713 are disposed on the surface of the chip body 711, and the second chip pad 713 is connected to the first chip pad 712 by a connecting circuit 716. In the embodiment, the connecting circuit 716 further connects a wire-bond pad 717. The wire-bond pad 717 is disposed on the periphery of the chip 71 that was originally intended for electrical connection with the substrate 72 via wire bonding but are later converted for flip-chip bonding. For chips that were originally intended for flip-chip bonding, the wire-bond pad 717 may not be present. The first chip pad 712, the second chip pad 713, the connecting circuit 716 and the wire-bond pad 717 are coplanar, that is, they are all disposed on the same layer/level of the chip body 711. The chip protecting material 714 covers the first chip pad 712, and exposes the second chip pad 713. The bump 715 is disposed on the exposed second chip pad 713. It is understood that the chip protecting material 714 may further cover other chip pads, and the chip pads are connected one another by the connecting circuit 716.

The substrate 72 comprises a substrate body 721, a first substrate pad 722, a second substrate pad 723 and a substrate protecting material 724. The substrate body 721 has a surface (not shown). The first substrate pad 722 is disposed on the surface of the substrate body 721, and connected to a first circuit 725. The position of the first substrate pad 722 corresponds to that of the first chip pad 712. The second substrate pad 723 is disposed on the surface of the substrate body 721, and connected to a second circuit 726. The position of the second substrate pad 723 corresponds to that of the second chip pad 713, and the bump 715 of the chip 71 connects the second substrate pad 723. In the embodiment, the first substrate pad 722, the second substrate pad 723, the first circuit 725 and the second circuit 726 are coplanar, that is, they are all disposed on the same layer/level of the substrate body 721. The substrate protecting material 724 covers the surface of the substrate body 721, and exposes the first substrate pad 722 and the second substrate pad 723.

In the embodiment, after the chip 71 is bonded to the substrate 72, the chip 71 is connected to the second circuit 726 on the left of the substrate 72 by the bump 715.

Figure 9:
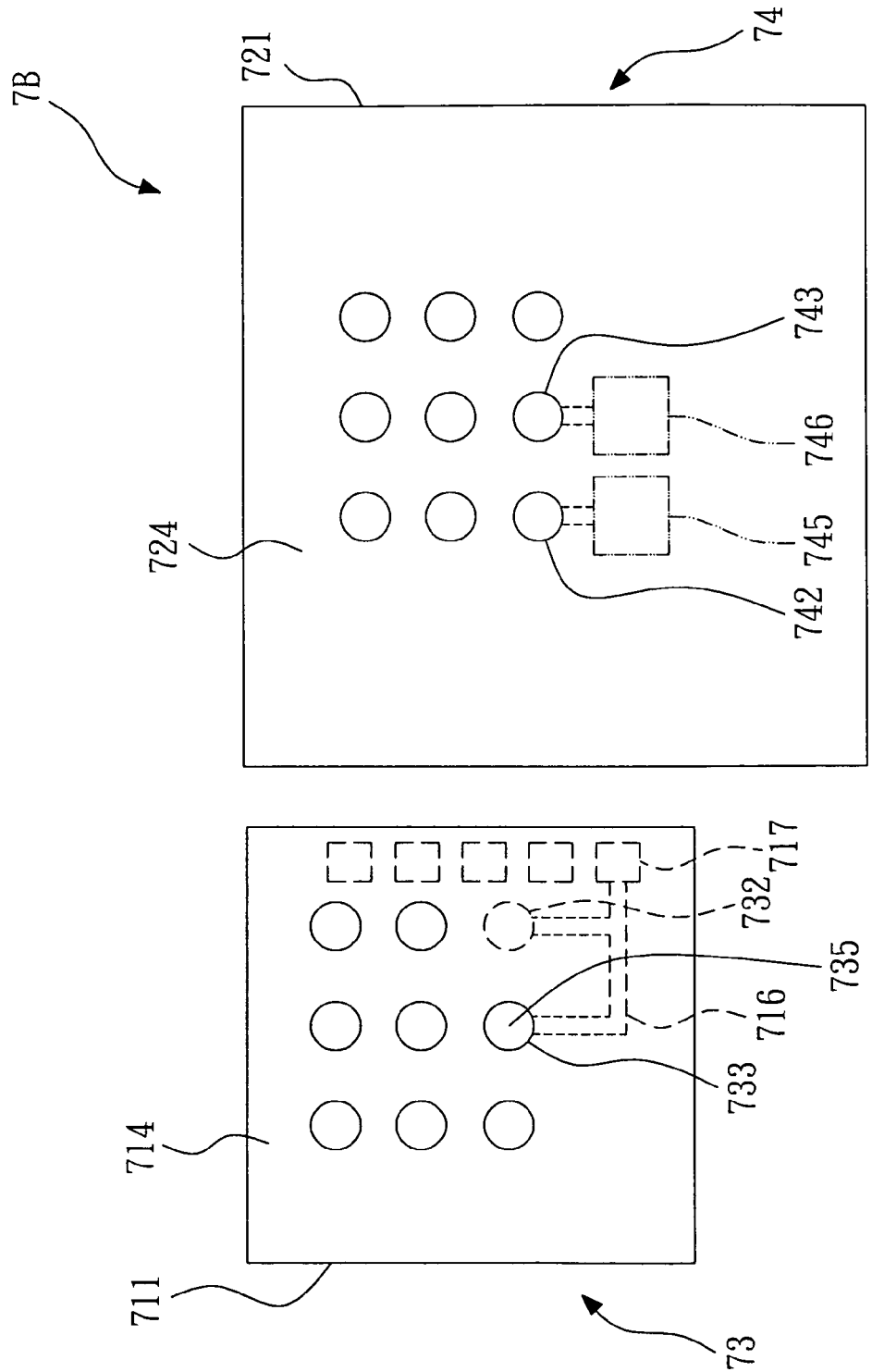
FIG. 9 is an exploded schematic view of a structure of flip chip bonding according to a fourth embodiment of the present invention.

FIG. 9 shows an exploded schematic view of a structure of flip chip bonding according to a fourth embodiment of the present invention. The structure 7B of flip chip bonding according to the fourth embodiment is substantially the same as the structure of flip chip bonding 7A (FIG. 8) according to the third embodiment, wherein the substrate 74 is exactly the same as the substrate 72 according to the third embodiment, but the reference numbers of the elements are different. The first substrate pad 742 on the left of the substrate 74 is the same as the second substrate pad 723 on the left of the substrate 72 (FIG. 8), the second substrate pad 743 on the right of the substrate 74 is the same as the first substrate pad 722 on the right of the substrate 72 (FIG. 8), the first circuit 745 on the left of the substrate 74 is the same as the second circuit 726 on the left of the substrate 72 (FIG. 8), and the second circuit 746 on the right of the substrate 74 is the same as the first circuit 725 on the right of the substrate 72 (FIG. 8).

In the embodiment, the first chip pad 732 on the right of the chip 73 corresponds to the second chip pad 713 on the right of the chip 71 (FIG. 8), and the first chip pad 732 is covered by the chip protecting material 714. The second chip pad 733 on the left of the chip 73 corresponds to the first chip pad 712 on the left of the chip 71 (FIG. 8), and the second chip pad to 733 is not covered by the chip protecting material 714, so the second chip pad 733 is exposed. A bump 735 is disposed on the second chip pad 733.

In the embodiment, after the chip 73 is bonded to the substrate 74, the chip 73 is connected to the first circuit 746 on the right of the substrate 74 by the bump 735.

The operation of the chips 71, 73 and the substrates 72, 74 in FIGS. 8 and 9 is described as below. First, choose a circuit to be connected (for example, the second circuit 726 on the left of the substrate 72 or the second circuit 746 on the right of the substrate 74). Afterward, when forming the chip protecting material 714, the undesired chip pad is covered (the first chip pad 712 on the left of the chip 71 and the first chip pad 732 on the right of the chip 73), and the desired chip pad is exposed (the second chip pad 713 on the right of the chip 71 and the second chip pad 733 on the left of the chip 73). Finally, the bumps 715, 735 are formed on the chip pads which are exposed, so as to connect corresponding substrate pads (the second substrate pad 723 on the left of the substrate 72 and the second substrate pad 743 on the right of the substrate 74). Therefore, different chips (the chip 71 and the chip 73 are different) are able to be bonded to the same substrate (the substrate 72 and the substrate 74 are the same) to connect different circuits, thus requiring fewer types of substrate and reducing the manufacturing cost.

Figure 10:
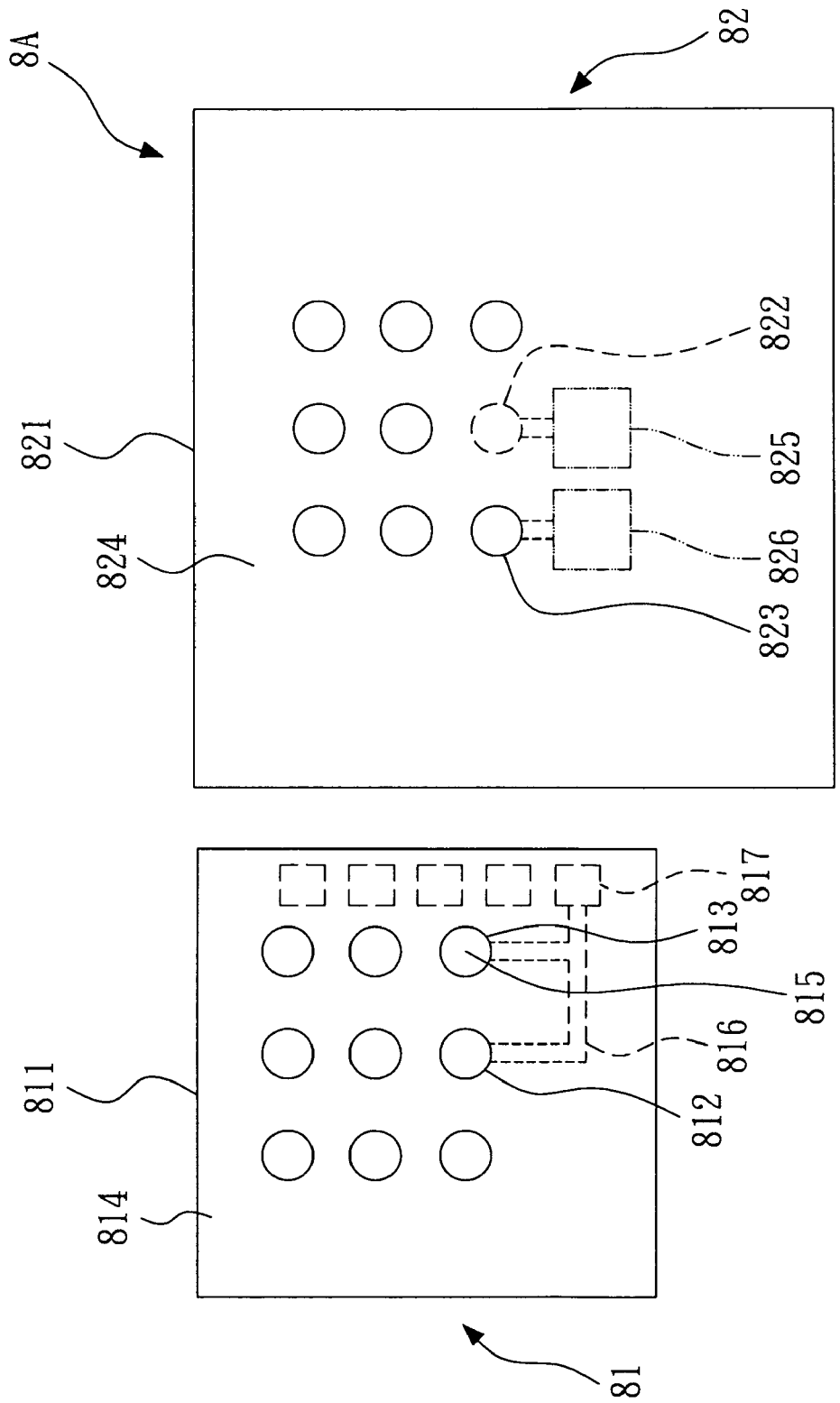
FIG. 10 is an exploded schematic view of a structure of flip chip bonding according to a fifth embodiment of the present invention.

FIG. 10 shows an exploded schematic view of a structure of flip chip bonding according to a fifth embodiment of the present invention. The structure 8A of flip chip bonding comprises a chip 81 and a substrate 82. The chip 81 comprises a chip body 811, a first chip pad 812, a second chip pad 813, a chip protecting material 814 and a bump 815. The chip body 811 has a surface (not shown). The first chip pad 812 and the second chip pad 813 are disposed on the surface of the chip body 811, and the second chip pad 813 is connected to the first chip pad 812 by a connecting circuit 816. In the embodiment, the connecting circuit 816 of the chip 81 further connects a wire-bond pad 817. The first chip pad 812, the second chip pad 813, the connecting circuit 816 and the wire-bond pad 817 are coplanar, that is, they are all disposed on the same layer/level of the chip body 811. The chip protecting material 814 covers the surface of the chip body 811, and exposes the first chip pad 812 and the second chip pad 813. The bump 815 is disposed on the second chip pad 813.

The substrate 82 comprises a substrate body 821, a first substrate pad 822, a second substrate pad 823 and a substrate protecting material 824. The substrate body 821 has a surface (not shown). The first substrate pad 822 is disposed on the surface of the substrate body 821, and connected to a first circuit 825. The position of the first substrate pad 822 corresponds to that of the first chip pad 812. The second substrate pad 823 is disposed on the surface of the substrate body 821, and connected to a second circuit 826. The position of the second substrate pad 823 corresponds to that of the second chip pad 813, and the bump 815 of the chip 81 connects the second substrate pad 823. In the embodiment, the first substrate pad 822, the second substrate pad 823, the first circuit 825 and the second circuit 826 are coplanar, that is, they are all disposed on the same layer/level of the substrate body 821. The substrate protecting material 824 covers the first substrate pad 822, and exposes the second substrate pad 823. It is understood that the substrate protecting material 824 further covers other substrate pads.

In the embodiment, after the chip 81 is bonded to the substrate 82, the chip 81 is connected to the second circuit 826 on the left of the substrate 82 by the bump 815.

Figure 11:
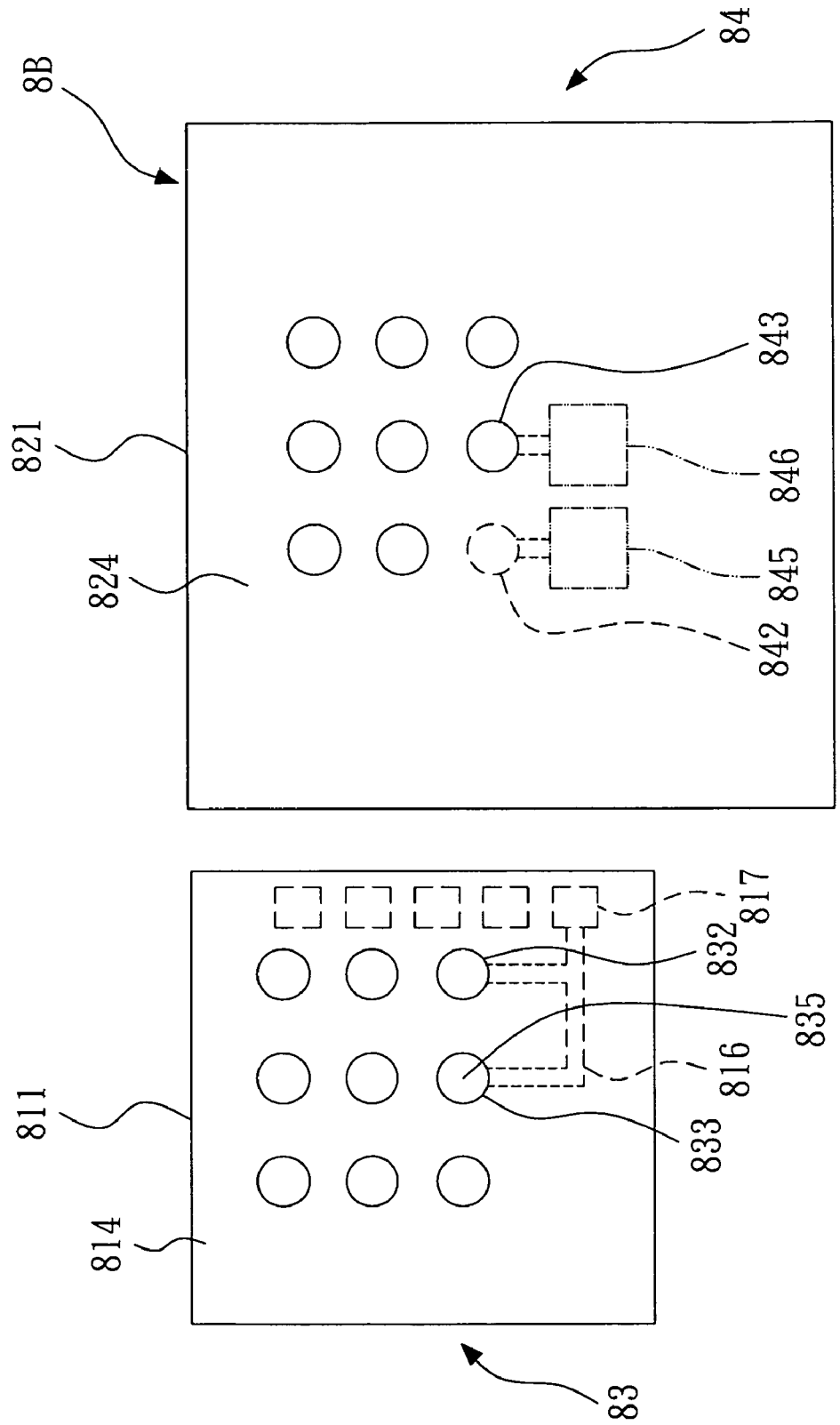
FIG. 11 is an exploded schematic view of a structure of flip chip bonding according to a sixth embodiment of the present invention.

FIG. 11 shows an exploded schematic view of a structure of flip chip bonding according to a sixth embodiment of the present invention. The structure 8B of flip chip bonding according to the sixth embodiment is substantially the same as the structure of flip chip bonding 8A (FIG. 10) according to the fifth embodiment, wherein the chip 81 is exactly the same as the chip 83 according to the fifth embodiment, but the reference numbers of the elements are different. The second chip pad 833 on the left of the chip 83 is the same as the first chip pad 812 on the left of the chip 81 (FIG. 10), and the first chip pad 832 on the right of the chip 83 is the same as the second chip pad 813 on the right of the chip 81 (FIG. 10). A bump 835 is disposed on the second chip pad 833.

In the embodiment, the first substrate pad 842 on the left of the substrate 84 corresponds to the second substrate pad 823 on the left of the substrate 82 (FIG. 10), and the first substrate pad 842 is covered by the substrate protecting material 824. The second substrate pad 843 on the right of the substrate 84 corresponds to the first substrate pad 822 on the right of the substrate 82 (FIG. 10), and the second substrate pad 843 is not covered by the substrate protecting material 824, so the second substrate pad 843 is exposed.

In the embodiment, after the chip 83 is bonded to the substrate 84, the chip 83 is connected to the second circuit 846 on the right of the substrate 84 by the bump 835.

The operation of the chips 81, 83 and the substrates 82, 84 in FIGS. 10 and 11 is described as below. First, choose a circuit to be connected (for example, the second circuit 826 on the left of the substrate 82 or the second circuit 846 on the right of the substrate 84). Afterward, when forming the substrate protecting material 824, the undesired substrate pad is covered (the first substrate pad 822 on the right of the substrate 82 and the first substrate pad 842 on the left of the substrate 84), and the desired substrate pad is exposed (the second substrate pad 823 on the left of the substrate 82 and the second substrate pad 843 on the right of the substrate 84). Therefore, a chip (the chip 81 and the chip 83 are the same) is able to be bonded to different substrates (the substrate 82 and the substrate 84 are different) to connect different circuits, thus requiring fewer types of chip and reducing the manufacturing cost.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A substrate having optional circuits, comprising:
a substrate body, having a surface;
at least one substrate pad, disposed on the surface of the substrate body;
a first conductive trace, connected to a first circuit, having a first breaking area, and thus forming a discontinuous line; and
a second conductive trace, connected to a second circuit, having a second breaking area, and thus forming a discontinuous line, wherein the second conductive trace and the first conductive trace are connected to the same substrate pad.

2. The substrate as claimed in claim 1, wherein the substrate pad, the first conductive trace, the first circuit, the second conductive trace and the second circuit are coplanar and disposed on the same layer of the substrate body.

3. A structure of flip chip bonding, comprising:
a chip, having an active surface and a backside surface, wherein the active surface has at least one bump; and
a substrate, comprising:
a substrate body, having a surface;
at least one substrate pad, disposed on the surface of the substrate body, wherein the bump connects the substrate pad;
a first conductive trace, connected to a first circuit, wherein the first conductive trace has a first breaking area and thus forms a discontinuous line; and
a second conductive trace, connected to a second circuit, wherein the second conductive trace has a second breaking area and thus forms a discontinuous line, the second conductive trace and the first conductive trace are connected to the same substrate pad, one of the first conductive trace and the second conductive trace is not an open circuit, and the other one is an open circuit.

4. The structure as claimed in claim 3, further comprising a conductor, wherein the conductor is disposed on the first breaking area or the second breaking area, so that one of the first conductive trace and the second conductive trace is connected.

5. The structure as claimed in claim 4, wherein the conductor is a passive device or made of conductive material.

6. The structure as claimed in claim 3, wherein the substrate pad, the first conductive trace, the first circuit, the second conductive trace and the second circuit are coplanar and disposed on the same layer of the substrate body.

7. A structure of flip chip bonding, comprising:
a chip, having an active surface and a backside surface, wherein the active surface has at least one bump; and
a substrate, comprising:
a substrate body, having a surface;
at least one substrate pad, disposed on the surface of the substrate body, wherein the bump connects the substrate pad;
a first conductive trace, connected to a first circuit; and
a second conductive trace, connected to a second circuit, wherein the second conductive trace and the first conductive trace are connected to the same substrate pad, one of the first conductive trace and the second conductive trace is not an open circuit, and the other one is an open circuit.

8. The structure as claimed in claim 7, wherein one of the first conductive trace and the second conductive trace is cut, so that one of the first conductive trace and the second conductive trace is an open circuit.

9. The structure as claimed in claim 7, wherein the substrate pad, the first conductive trace, the first circuit, the second conductive trace and the second circuit are coplanar and disposed on the same layer of the substrate body.

10. A structure of flip chip bonding, comprising:
a chip, comprising:
a chip body, having a surface;
a first chip pad, disposed directly on the surface of the chip body;
a second chip pad, disposed directly on the surface of the chip body and connected to the first chip pad by a connecting circuit;
a chip protecting material, covering the first chip pad and exposing the second chip pad; and
a bump, disposed on the exposed second chip pad; and
a substrate, comprising:
a substrate body, having a surface;

a first substrate pad, disposed on the surface of the substrate body and connected to a first circuit, wherein the position of the first substrate pad corresponds to that of the first chip pad;

a second substrate pad, disposed on the surface of the substrate body and connected to a second circuit, wherein the position of the second substrate pad corresponds to that of the second chip pad, and the bump of the chip connects the second substrate pad; and a substrate protecting material, covering the surface of the substrate body and exposing the first substrate pad and the second substrate pad.

11. The structure as claimed in claim 10, wherein the first chip pad, the second chip pad and the connecting circuit are coplanar and disposed on the same layer of the substrate body.

12. The structure as claimed in claim 10, wherein the first substrate pad, the second substrate pad, the first circuit and the second circuit are coplanar and disposed on the same layer of the substrate body.

13. The structure as claimed in claim 10, wherein the connecting circuit of the chip further connects a wire-bond pad.

14. A structure of flip chip bonding, comprising:
a chip, comprising:
a chip body, having a surface;
a first chip pad, disposed directly on the surface of the chip body;
a second chip pad, disposed directly on the surface of the chip body and connected to the first chip pad by a connecting circuit;
a chip protecting material, covering the surface of the chip body and exposing the first chip pad and the second chip pad; and
a bump, disposed on the second chip pad; and
a substrate, comprising:
a substrate body, having a surface;
a first substrate pad, disposed on the surface of the substrate body and connected to a first circuit, wherein the position of the first substrate pad corresponds to that of the first chip pad;
a second substrate pad, disposed on the surface of the substrate body and connected to a second circuit, wherein the position of the second substrate pad corresponds to that of the second chip pad, and the bump of the chip connects the second substrate pad; and
a substrate protecting material, covering the first substrate pad and exposing the second substrate pad.

15. The structure as claimed in claim 14, wherein the first chip pad, the second chip pad and the connecting circuit are coplanar and disposed on the same layer of the chip body.

16. The structure as claimed in claim 14, wherein the first substrate pad, the second substrate pad, the first circuit and the second circuit are coplanar and disposed on the same layer of the substrate body.

17. The structure as claimed in claim 14, wherein the connecting circuit of the chip further connects a wire-bond pad.

* * * * *